United States Patent [19]

O'Neill

[11] Patent Number: 5,131,978
[45] Date of Patent: Jul. 21, 1992

[54] LOW TEMPERATURE, SINGLE SIDE, MULTIPLE STEP ETCHING PROCESS FOR FABRICATION OF SMALL AND LARGE STRUCTURES

[75] Inventor: James F. O'Neill, Penfield, N.Y.

[73] Assignee: Xerox Corporation, Stamford, Conn.

[21] Appl. No.: 534,467

[22] Filed: Jun. 7, 1990

[51] Int. Cl.⁵ ............................................. C23F 1/00
[52] U.S. Cl. .................................. 156/653; 156/644; 156/662; 346/140 R
[58] Field of Search ............... 156/644, 647, 653, 657, 156/661.1, 662; 346/1.1, 76 R, 140 R

[56] References Cited

U.S. PATENT DOCUMENTS

| | | | |
|---|---|---|---|
| Re. 32,572 | 1/1988 | Hawkins et al. | 156/626 |
| 4,601,777 | 7/1986 | Hawkins et al. | 156/626 |
| 4,789,425 | 12/1988 | Drake et al. | 156/644 |
| 4,961,821 | 10/1990 | Drake et al. | 156/647 |

*Primary Examiner*—Joseph Golian
*Assistant Examiner*—Leslie Wong
*Attorney, Agent, or Firm*—Oliff & Berridge

[57] ABSTRACT

A fabrication process for wafer derived elements such as channel plates for thermal ink jet printers includes formation of a final etchant pattern in first and second masking layers. The second masking layer is a protective layer to prevent removal of the first layer upon removal of a subsequent third masking layer. Preferably, the second masking layer is an oxide applied under low temperature condition to lessen the possibility of inducing formation of oxygen precipitates in the wafer. A third masking layer is formed over the final etchant pattern formed by the first and second masking layers. The third masking layer is patterned to form a precursor structure of a large structure contained in the final etchant pattern. After formation of the precursor structure, the third masking layer is removed and the wafer is subjected to a final etching exposure to form the final etched structures. The process is useful for forming channel plates for thermal ink jet printheads.

22 Claims, 3 Drawing Sheets

LOW TEMPERATURE, SINGLE SIDE, MULTIPLE STEP ETCHING PROCESS FOR FABRICATION OF SMALL AND LARGE STRUCTURES

BACKGROUND OF THE INVENTION

1. Field of the Invention

This invention relates to a low temperature, single side, multiple step orientation dependent etching process for the fabrication of three dimensional structures from silicon, and more particularly to the use of this process for the mass production of ink jet printheads.

2. Description of the Related Art

In the manufacture of semiconductor structures, it is frequently desirable to generate large recesses or holes in association with relatively shallow recesses, which may or may not interconnect. For example, an ink jet printhead may be made of a silicon channel plate and a heater plate. Each channel plate has a relatively large ink manifold/reservoir recess or opening and a set of parallel, shallow, elongated channel recesses connected to the reservoir at one end and open at the other end. When aligned and bonded with a heater plate, the recesses in the channel plate become the ink reservoir and the ink channels, as described more fully in U.S. Pat. No. 4,601,777 to Hawkins et al, the disclosure of which is incorporated herein by reference.

In such printheads, it is frequently desirable to form a relatively large or deep reservoir, which is often etched completely through a 10-30 mil thick <1-0-0> wafer, and small or shallow channels, which may be only 1-5 mils deep. One manner of forming such channel plates is by a one step method in which the reservoir and channels are patterned in a single plasma silicon nitride masking layer. The drawback of this method is that the channels are etched for the same length of time as the much larger reservoir and through-etched fill hole. This can result in loss of dimensional control because of the increased probability of the channel intercepting a defect in the wafer crystal. Also, the long etch time can cause the channel width to grow or in crease if the pattern is not accurately aligned with the <1-1-0> plane of the wafer. Another critical drawback of the single step process is the potential for intra-channel width variation resulting from slicing the wafer off the <1-0-0> axis. If there is an off axis condition in the plane of the wafer, long duration etching is likely to form channels wider at one end than the other or non-symmetrical about a centerline.

One method for overcoming the disadvantages of the single step process involves forming the channels and the reservoir in separate etching steps and then subsequently joining them by a variety of methods, such as isotropic etching, machining the silicon material between the reservoir and the channel, or use of a thick film layer on the heater plate that is patterned and etched to form ink flow bypasses. Generally, such a structure is formed by etching a plurality of reservoirs in a <1-0-0> silicon wafer first, and then accurately aligning the channels to the edge of the reservoir in a second lithography step, followed by etch mask delineation and a second short orientation dependent etching (ODE) step, sufficient to etch the depth of the plurality of associated channels. An advantage of such a process is enhanced control of channel dimensioning because the mask defining the channels will be undercut about one-tenth as much as would be the case when the channels and the reservoir are delineated simultaneously.

The problem with such a two-step process is that it is difficult to do a second lithography step with an ODE etched wafer because of the large steps and/or etched through holes resulting from the first etching step. The resulting resist mask is nonuniform and this results in a nonuniformity of fine structures, such as the ink jet channels.

There is another two step process for forming the reservoir and the channels in a channel wafer by etching. This process is disclosed in U.S. Pat. No. 4,863,560 to Hawkins, the disclosure of which is incorporated herein by reference. In this process, the reservoir and any necessary throughholes are formed through a coarse silicon nitride mask as the wafer undergoes a relatively a long length etching process. Then the nitride mask is stripped to expose a previously patterned high temperature silicon oxide masking layer that is used in a subsequent, shorter duration, channel etching step. This process avoids the channel width variation problems associated with the previously described single step process, as the channels are formed during a very short etch duration step. The short etch time assures that rotational problems or taper resulting from mask misalignment are not likely to arise. However, the oxide masking layer for channel etching is a high temperature thermal oxide process, usually carried out at temperature of about 1100° C., which can generate a high concentration of oxygen precipitate defects in the wafer and disruption of the crystal lattice. Such defects can cause loss of dimensional control, especially of the channels, and result in unusable channel plates. Also, the oxide layer is subject to considerable erosion in some anisotropic etches, for example, potassium hydroxide.

U.S. Pat. No. 4,063,271 to Bean et al discloses the use of low temperature oxides as a masking material for ODE separation of epitaxial layers forming semiconductor devices but does not disclose the use of such a material in the formation of large and fine structures in a silicon wafer.

U.S. Pat. No. 4,507,853 discloses the use of a low temperature oxide layer, usually in conjunction with a high temperature oxide layer, to insulate an element of a semiconductor from a metal conductor strip. The patent does not disclose formation of large and fine structures in a silicon wafer by such techniques.

U.S. Pat. No. 4,238,683 shows fabrication of gates of a silicon semiconductor by deposition of a silicon nitride layer followed by deposition of a low temperature oxide layer. The oxide and nitride layers are etched to form openings. The oxide layer is then partially removed to bare the nitride layer for subsequent removal. There is no disclosure of formation of fine and large structures in the silicon wafer.

U.S. Pat. No. 4,849,344 discloses the deposition of low temperature oxide for filling shallow grooves or trenches between epitaxial islands. The grooves are lined with a thin, thermally grown isolation oxide layer. The patent does not disclose the formation of fine and large structures by the use of low temperature oxides.

OBJECTS AND SUMMARY OF THE INVENTION

It is an object of this invention to improve processes for forming fine structures in the surface of silicon wafers by etching processes.

It is another object of this invention to produce both large and fine structures on silicon wafers by etching.

It is a further object of the invention to improve uniformity of channel formation in ink jet channel plates and avoid potential defects arising from high temperature mask formation.

These and other objects are achieved, and the shortcomings discussed above are overcome, by using a single side, two step, process wherein a first pattern incorporating fine structure(s) and large structure(s) are removed from layers of a first fine masking layer and a second, protective, masking layer previously deposited on the wafer. A coarse masking layer is then deposited and a second pattern, within the boundaries of the first pattern is removed therefrom. The applications of the first, second, and third masking layers are carried out at temperatures below the range in which oxygen precipitates are formed in the wafer. The wafer is etched through the second pattern to form a precursor to the large structure. The coarse masking layer, and optionally the protective masking layer, are stripped prior to final etching, during which fine structures are formed in the wafer and the large structure is fully etched. The protective masking layer protects the first masking layer from removal at the time the third masking layer is removed, prior to the final etching step.

BRIEF DESCRIPTION OF THE DRAWINGS

The invention will be described in detail with reference to the following drawings in which like reference numerals refer to like elements and wherein.

DESCRIPTION OF THE PREFERRED EMBODIMENT

Figure 1:
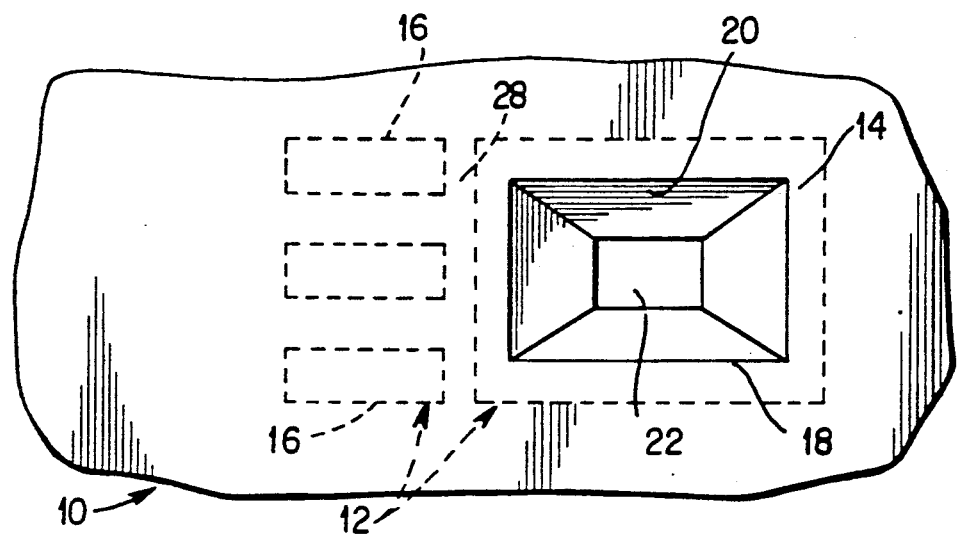
FIG. 1 is a partial plan view of a channel plate which has undergone a first etching step.

FIG. 1 is an idealized representation of a step in the process of fabricating an ink jet printer channel plate utilizing the teachings of the present invention. FIG. 1 shows a portion 10 of a planar wafer made from, for example, silicon. As will be discussed more fully hereinafter, the silicon wafer has had first and second masking layers applied to it which have been exposed to known processes for delineating and removing portions thereof to form a first mask pattern 12, which first pattern 12 includes a reservoir portion 14 and a plurality of channels 16. The portions 14 and 16 can form a mask pattern of structures in a final desired form or etch pattern in the wafer. Preferably, the pattern incorporates a separation between reservoir and the channels by a land 28, for purposes hereafter described. The first pattern 12 is shown in phantom view as it has been overlaid with a third masking layer having a second pattern 18, which has been formed in the third masking layer as hereinafter described. The second mask pattern 18 falls within the boundaries of the first mask pattern 12. After formation of the second mask pattern 18, the wafer is subjected to an etching process, such as ODE, to form a precursor structure 20. FIG. 1 illustrates the formation of such a precursor structure 20 after exposure of the wafer to a relatively long duration etching process. The precursor structure coincides with a large or relatively deep structure to be formed in or through the wafer. In the illustrated embodiment, this large portion of the structure is the reservoir portion 14 which, advantageously, extends entirely through the wafer and forms a through hole 22 in the wafer.

Figure 2:
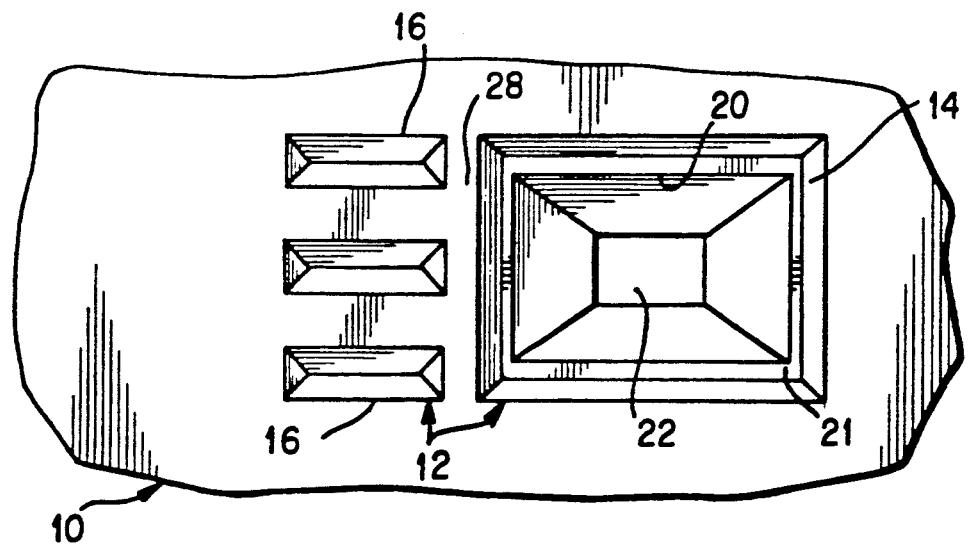
FIG. 2 is a partial plan view of a channel plate which has undergone a second etching step.

FIG. 2 illustrates completion of the formation of a gross structure, such as reservoir 14, and fine structures, such as channels 16, as a result of a second ODE process, to complete formation of the structures in the first pattern 12. FIGS. 1 and 2 are idealized representations of intermediate and finished forms of structures in the wafer portion 10. In a commercial fabrication arrangement, the reservoir would extend in transverse directions of the wafer portion 10 and would include many more channels 16. In addition, auxiliary structures such as locating holes would also be formed in the wafer portion 10. See U.S. Pat. No. 4,601,777. In the two step etching process used, it is common for a step or ledge 21 to be formed in the reservoir as a result of the second etching step.

Figure 3A:
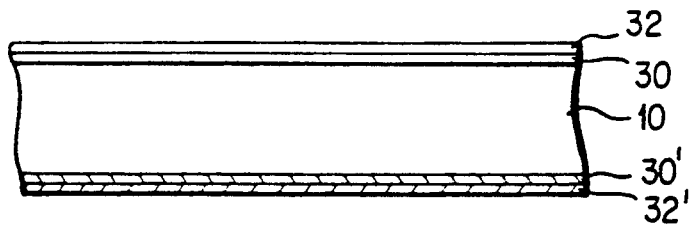
FIG. 3A is a partial cross-sectional view of a wafer to be formed into a channel plate and having first and second masking layers applied.

Referring to FIG. 3A, the channel plate is formed from a substantially planar wafer portion 10 onto which a first masking layer 30 is applied. The preferred material for the masking layer 30 is pyrolitically deposited silicon nitride. The methods of forming such layers are known to those of skill in the art and no further discussion thereof is necessary. Other low temperature methods for depositing the silicon nitride layer can be used, for example chemical vapor deposition (CVD) as disclosed in U.S. Pat. No. 4,601,777. Pyrolytic deposition and CVD are conducted at temperatures of about 800° C. This temperature is below the 1000°-1100° C. range at which a significant amount of oxygen is dissolved within the wafer, with resulting redistribution and agglomeration upon cooling. Thus, this step is unlikely to increase the concentration of oxygen precipitates within the wafer.

A second or protective layer of masking material 32 is formed on the silicon nitride layer masking layer 30. The preferred material for the layer 32 is a low temperature silicon oxide material deposited by chemical vapor deposition techniques. Such materials are known in the art, and are commonly available under the name LOTOX. Application of the layer 32 can be accomplished by either a low temperature oxide deposit or a plasma enhanced chemical vapor deposition. These processes are carried out at temperatures in the range of about 400°-500° C. and, thus, are below the point at which there is any significant redistribution of oxygen within the wafer. The masking layer 32 forms a protecting layer over the first masking layer 30 as will hereinafter be explained.

The deposition of the first and second layers is a double sided process and results in the formation of silicon nitride layer 30, and low temperature oxide layer 32' on the bottom of the wafer. These layers are removed as the corresponding masking layers are removed from the upper surface of the wafer.

Figure 3B:
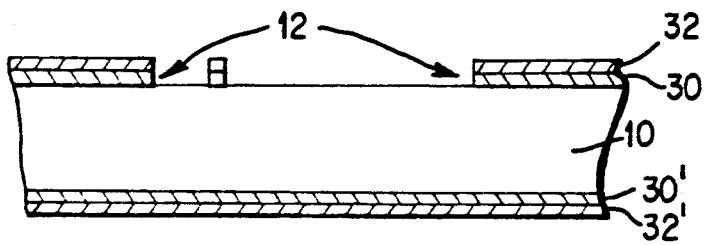
FIG. 3B is a partial cross-sectional view of a subsequent step in the process showing the removal of portions of the first and second masking layers to form a first pattern incorporating fine and large structures.

After the layer 32 is applied, photo-imagable layer (not shown) is applied over the layer 32 and is patterned by known techniques, such as photolithography, to yield a mask having the pattern for forming the finished configuration of reservoir 14 and channels 16 (FIG. 1). The second masking layer 32 is etched with an appropriate wet etchant, such as a buffered oxide etch. After the second masking layer is etched, the first masking layer 32 is etched, for example by plasma etching. Alternatively the second masking layer and first masking layer are sequentially plasma etched, using appropriate mixtures of gases for removing each layer. As shown in FIG. 3B, after the completion of both etching steps, a full pattern opening 12 for the reservoir 14 and for the channels 16 exists in the masking layers 30 and 32. After completion of the etching of the masking layers 30 and 32, the photo-imagable material is removed.

Figure 3C:
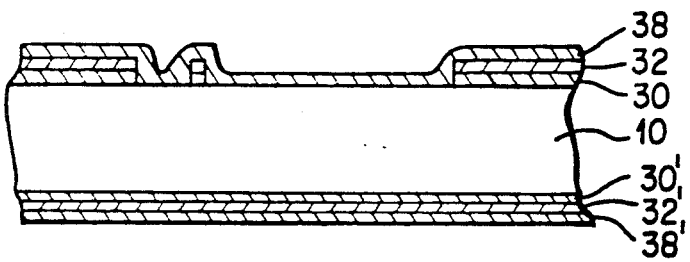
FIG. 3C is a partial cross-sectional view of a further step in the process in which a third masking layer is applied to the intermediate fabrication of FIG. 3B.
Figure 3D:
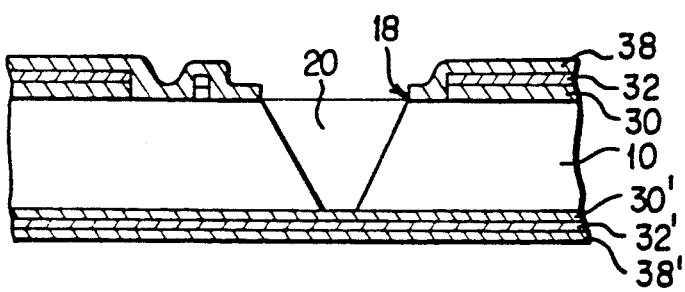
FIG. 3D is a partial cross-sectional view of a further step in the process in which a second pattern is formed in the third masking layer and a precursor structure of the large structure is formed.

Referring to FIG. 3C, in the next step in the fabrication of the channel plate, a third masking layer 38, preferably of plasma deposited silicon nitride is formed over the remaining portions of the first and second masking layers and over the exposed surfaces of the wafer formed by the opening 12. A layer 38' is also formed on the bottom of the wafer. A second photoimagable layer (not shown) is applied over the third masking layer 38 and is patterned by known techniques, again such as photolithography, to form a second pattern 18 which is located in the area of the reservoir 14. Referring to FIG. 3D, the second pattern provides an opening 18 in the mask which is smaller than the finished lateral dimensions of the reservoir 14. When the third masking layer 38 is subjected to a plasma etching process, a second mask pattern, having an opening or via 18, is formed in the masking layer 38.

An optional scratch resistant layer, such as polysilicon, can be applied over the LOTOX layer and the third masking lay to prevent scratches in the masks or wafer during subsequent processing. Scratches present opportunities for attack by an etchant in an uncontrolled manner. The polysilicon layer is applied before the photo-imagable layer is applied to the second and third masking layers and can be patterned by wet etching or plasma etching, followed by patterning of the second and third layers. The polysilicon can be removed by using an ODE etchant, such as a KOH, isopropyl alcohol, and water solution. When such a scratch resistant layer is applied to the second masking layer, it is removed prior to the application of the third masking layer.

After formation of opening 18, the channel plate is subjected to a first anisotropic etching step to form a reservoir precursor structure or cavity 20 in the surface of the wafer. Such etching processes are well known in the art and are disclosed in U.S. Pat. No. 4,601,777. Therefore no further discussion of such processes is necessary. The first wafer etching step can be of relatively long duration, for example, four hours, to form a significant portion of the finished reservoir 14.

Figure 3E:
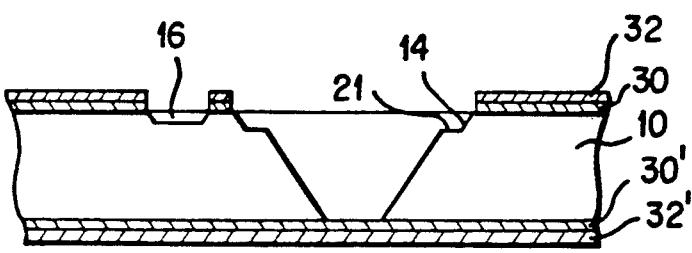
FIG. 3E is a partial cross-sectional view of the wafer after the third masking layer has been removed and the wafer has been subjected to the second etching step.
Figure 3F:
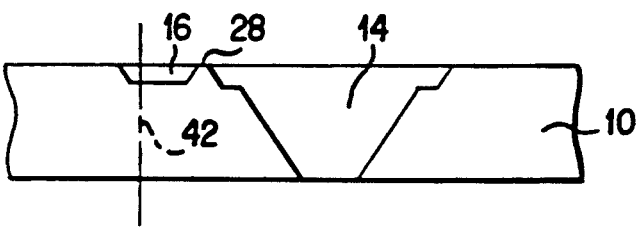
FIG. 3F is a partial sectional view of the wafer after removal of all masking layers.

Referring to FIG. 3E, after the first wafer etching step is terminated, the third masking layer 38 is removed in a suitable manner, such as plasma etching or wet etching in phosphoric acid. When the third masking layer 38 is removed, the first and second masking layers 30, 32 remain on the surface of the wafer. The low temperature oxide masking layer 32 prevents removal of the first masking layer 30 and has, in essence, protected the first masking layer 30 of silicon nitride during removal of the third masking layer 38, also of silicon nitride.

At this stage in the process, the second masking layer 32 can be removed or can be left in place.

The wafer is then exposed to a second anisotropic etching, step through the remaining masking layers 30, 32 (or 30 alone), which, it will be recalled, are in the finished pattern of the reservoir 14 and channels 16. Upon the termination of the second etching process, the reservoir 14 and channels 16 are completely formed and a land 28 separates the channels from the reservoir. This second etchant exposure step can be of relatively short duration, just sufficient to form the channels 16. Thus the channels 16 are not subjected to a relatively long etching process which can adversely affect channel uniformity, as previously described. Alternatively, the second etching step can be an isotropic etch.

After termination of the final etching step, the masking layer 30 and the masking layer 32 (if not previously removed) are removed. The wafer portion 10 now has a fully formed reservoir 14 having a through opening 22 and channels 16. A ridge or land 28 has been formed in the wafer between the reservoir 14 and the channels 16. It is preferred to maintain the land in place on the channel plate and provide for passage of ink from the reservoir to the channels by an ink bypass formed in an associated heater plate, as will hereinafter be described. Forming land 28 is desirable because orientation dependent etching processes produce poor formation of outside angles and this results in variable channel length. If desired, grooves (not shown) are machined through the ridge to provide communication between the channels 16 and the reservoir 14. Suitable machining techniques for forming such grooves are well known. Alternatively, the mask pattern 12 can provide for communication between the channels and the reservoir in the second wafer etch step. Although the foregoing description is in the context of a single channel die, it should be realized that many channel dies are formed simultaneously in this process from a single silicon wafer.

Figure 4:
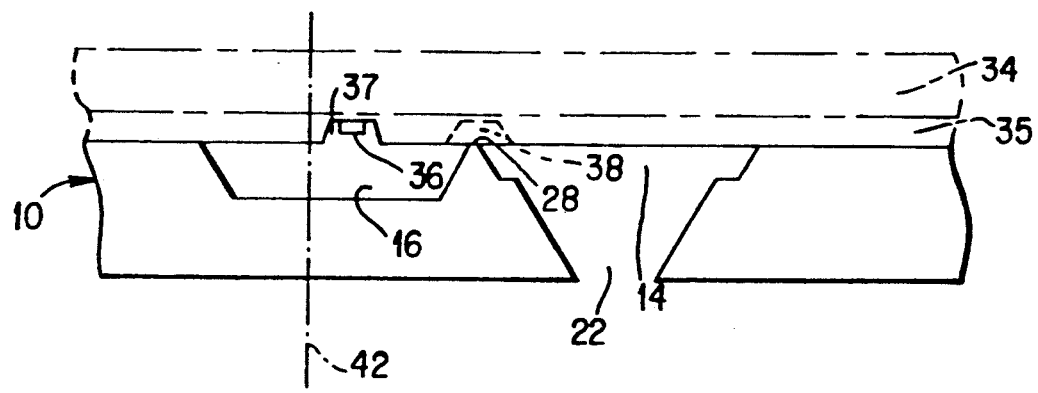
FIG. 4 is a side sectional view of an assembled ink jet printhead subunit utilizing a channel plate made in accordance with the invention.

FIG. 4 shows, in cross-section, use of the wafer portion 10 to form a thermal ink jet printhead. The channel recesses 16 have been etched and the reservoir 14 enlarged to its final shape. A heater plate 34 is aligned and bonded onto channel plate wafer 10 by known techniques, such as those disclosed in U.S. Pat. No. 4,601,777. The heater plate 34 includes a polyimide layer 35. A heating element 36 is disposed in a bubble chamber 37 formed in the polyimide layer. A heating element 36 is associated with each channel 16 and each heater element is separately addressable by an electrode arrangement as disclosed in U.S. Pat. No. 4,601,777. Further the polyimide layer 35 of heater plate 34 includes an ink bypass 38 for providing for ink flow from the reservoir to the channels over land 28. In order to form nozzles at the end of each channel 16, the joined channel plate 10 and heater plate 34 are separated along line 42, preferably in a dicing operation using a resinoid cutting blade. In this manner, a subunit is made that includes a fully formed reservoir 14 and a plurality of aligned channels 16, each channel having a nozzle at one end thereof and being in communication with the ink reservoir 14 at the other end thereof. The subunit includes a through hole 22 for registration with a means for supplying ink to the reservoir 14.

In summary, this invention relates to batch fabrication of three dimensional silicon structures by a single side, multi-step ODE processing technique. The masks are formed on one side with the coarse mask last and the highest tolerance or finest mask first. Coarse etching is carried out first and fine etching is carried out last. A protective masking layer is utilized to prevent removal of a first applied fine mask when a subsequent coarse mask is removed. After the coarse anisotropic etching is completed, the coarse mask is removed and, preferably, a second anisotropic etch is done. The fabrication of structures having both deep recesses or large through holes and shallow high tolerance recesses can be done much faster by a first fast, less controllable etch and a second slower, more controllable etch. Because the masks are formed at temperatures below the range in which there is substantial redistribution of oxygen within the wafer, the likelihood of creating defects as a result of the formation of oxygen precipitates is substantially eliminated. Using the two silicon nitride layers for two consecutive mask etch processes also avoids the problem of mask layer erosion associated with use of silicon dioxide masking layers in KOH etching processes.

Although the foregoing description illustrates the preferred embodiment as a thermal ink jet printer channel plate, other variations and other three dimensional silicon structures are possible. All such variations and other structures are intended to be included within the scope of this invention as defined by the following claims.

What is claimed is:

1. A method of making a silicon body having fine and large structures formed therein by etching, comprising:
   applying a first layer of masking material to a surface of the body;
   applying a second layer of a protective masking material different from the first layer of masking material, on the first masking layer;
   forming a first pattern on the protective masking layer, including the fine and large structures, for forming the desired finished structures on said body surface;
   removing the portions of the first and protective layers in the first pattern to expose portions of said body surface in said first pattern in a first mask forming step;
   applying a third layer of a masking material on the first and second layers of masking material and on portions of said body surface exposed in the first mask removal step;
   forming a second pattern on the third layer of masking material to form a second pattern formed within the boundaries of the first pattern;
   removing portions of the third layer of masking material in the second pattern to expose portions of said body surface in a second mask forming step;
   exposing said body surface to an etchant for said body surface through the second pattern to form a precursor structure on the body surface, in a first etching step;
   removing from said body surface any portions of the third layer of masking material which remained after the second mask forming step;
   exposing said body surface including said precursor structure, to an etchant for the body surface to form structures through the first pattern, in a second etching step.

2. A method as in claim 1, wherein the steps of exposing the body surface to an etchant comprise orientation dependent etching.

3. A method as in claim 1, wherein the steps of applying the first and third layers comprise vapor deposition of a nitride.

4. A method as in claim 3, wherein the step of applying the protective layer comprises depositing a low temperature oxide.

5. A method as in claim 4, wherein the low temperature oxide is silicon dioxide.

6. A method as in claim 5, wherein the steps of exposing the surface to an etchant comprise orientation dependent etching.

7. A method as in claim 6, wherein the body is a silicon wafer.

8. A method as in claim 7, wherein the silicon body is a <1-0-0> silicon.

9. A method as in claim 1, wherein the steps of exposing the surface to an etchant form a through hole in the body.

10. A method as in claim 1, wherein the protective layer of masking forming the first pattern, is removed before the second etching step.

11. A method as in claim 7, wherein the steps of applying the first, second and third layers of masking material take place at temperatures below those at which there is substantial redistribution of oxygen within the silicon body.

12. A method as in claim 11, wherein the first, second and third layers are applied at temperatures below about 1000° C.

13. A method of forming a channel plate for an ink jet printer having a plurality of channels and a reservoir from a silicon wafer comprising:
   applying a firs layer of a masking material to a surface of the wafer;
   applying a protective second layer of masking material of a material different from the first layer on the first layer;
   forming a first pattern on the second masking layer, for forming the reservoir and said plurality of channels;
   removing a portion of the first layer and the second layer of masking material from the wafer surface to expose the wafer surface in said first pattern in a first mask removal step;
   applying a third masking layer of a material different from the protective masking layer on the first and second masking layers and the portion of said wafer surface exposed in said first mask removal step;
   forming a second pattern on the third masking layer overlying and spaced from edges of the reservoir in the first pattern;
   removing a portion of the third masking layer to expose said surface of the water in a second pattern;
   exposing the wafer to an etchant through the second pattern to form a portion of the reservoir in the wafer;
   removing from said wafer surface any portion of the third layer of masking material which remained after the second mask forming step to expose the portions of said surface in the first pattern for forming the reservoir and the channels; and exposing the wafer to an etchant through said first pattern to form said channels and portions of the reservoir in said first pattern.

14. A method as in claim 13, wherein the steps of exposing the wafer to an etchant comprise orientation dependent etching.

15. A method as in claim 13, wherein the step of applying the first and third masking layers comprises vapor deposition of a nitride.

16. A method as in claim 15, wherein the step of applying the second masking layer comprises deposition of a low temperature oxide.

17. A method as in claim 16, wherein the oxide is silicon dioxide.

18. A method as in claim 17, wherein the step of exposing the wafer to an etchant comprises orientation dependent etching.

19. A method as in claim 13, wherein the etchant exposure steps comprise forming the reservoir as a through hole in the wafer.

20. A method as in claim 13, wherein the steps of applying the first, second and third layers of masking material take place at temperatures below those at which there is substantial redistribution of oxygen within the silicon body.

21. A method as in claim 20 wherein the first, second and third layers are applied at temperatures below about 1000° C.

22. A method as in claim 13, wherein the etching step through the first pattern is isotropic.

* * * * *